United States Patent [19]
Lee

[11] Patent Number: 5,895,246
[45] Date of Patent: Apr. 20, 1999

[54] METHOD OF MAKING SEMICONDUCTOR DEVICE WITH AIR GAP BETWEEN THE GATE ELECTRODE AND SUBSTRATE DURING PROCESSING

[75] Inventor: Sang Don Lee, Chungcheongbuk-do, Rep. of Korea

[73] Assignee: LG Semicon Co., Ltd., Chungcheongbuk-Do, Rep. of Korea

[21] Appl. No.: 09/031,821

[22] Filed: Feb. 27, 1998

[30]     Foreign Application Priority Data

Sep. 29, 1997 [KR] Rep. of Korea ............ 49795/97

[51] Int. Cl.⁶ ..................... H01L 21/3205; H01L 21/336
[52] U.S. Cl. .................... 438/305; 438/585; 438/595
[58] Field of Search ............................... 438/301, 305, 438/585, 303, 595

[56]         References Cited
         U.S. PATENT DOCUMENTS 5,395,779  3/1995  Hong .
5,578,513  11/1996  Maegawa .
5,693,545  12/1997  Chung et al. .
5,736,446  4/1998  Wu ............................................. 438/305
5,770,507  6/1998  Chen et al. ................................ 438/305

OTHER PUBLICATIONS

M. Togo et al., "A Gate–side Air–gap Structure (GAS) to Reduce the Parasitic Capacitance in MOSFETs"; 1996 Symposium on VLSI Technology, Digest of Technical Papers; pp. 38 and 39; Jun. 11–13, 1996.

*Primary Examiner*—Richard A. Booth
*Attorney, Agent, or Firm*—Morgan, Lewis & Bockius LLP

[57]             ABSTRACT

A semiconductor device includes a semiconductor substrate of a first conductivity type having an active region and an inactive region, a gate electrode formed on the semiconductor substrate over the active region, wherein a gap exists between the semiconductor substrate and the gate electrode, and source and drain regions formed beneath a surface of the semiconductor substrate at both sides of the gate electrode.

9 Claims, 12 Drawing Sheets

FIG. 16D

METHOD OF MAKING SEMICONDUCTOR DEVICE WITH AIR GAP BETWEEN THE GATE ELECTRODE AND SUBSTRATE DURING PROCESSING

This application claims the benefit of Korean patent application No. 49795/1997, filed Sep. 29, 1997, which is hereby incorporated by reference.

BACKGROUND OF THE INVENTION

1. Field of the Invention

The present invention relates to a high voltage semiconductor device, and, more particularly, to a metal air semiconductor field effect transistor (MASFET) and a method for fabricating the same.

2. Discussion of the Related Art

In a typical metal oxide semiconductor (MOS) device, an oxide film (such as $SiO_2$) is deposited on a surface of a semiconductor (such as Si), and a metal layer is formed on the oxide film. In a metal oxide semiconductor field effect transistor (MOSFET), a gate insulating film, made of an oxide, and a gate electrode are successively formed on a silicon substrate of a first conductivity type, and source and drain impurity regions are formed beneath the surface of the silicon substrate at both sides of the gate electrode. A MOSFET controls a current (channel current) flowing between the source and drain impurity regions by varying a potential of the gate electrode.

A conventional MOSFET will be described with reference to the accompanying drawings.

Figure 1:
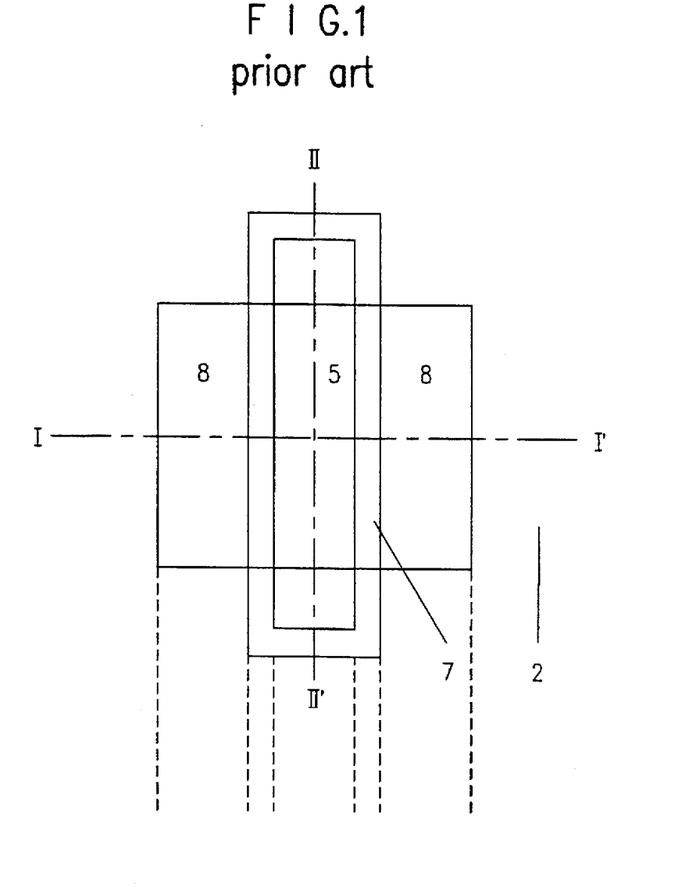
FIG. 1 is a plan view of a conventional MOSFET.
Figure 2:
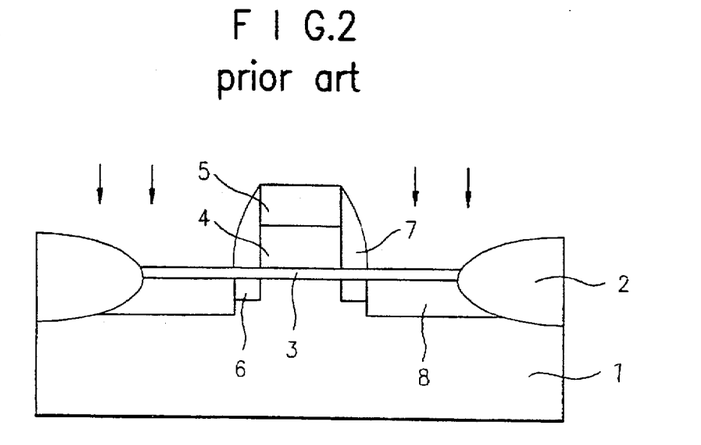
FIG. 2 is a cross-sectional view taken along line I—I of FIG. 1.
Figure 3:
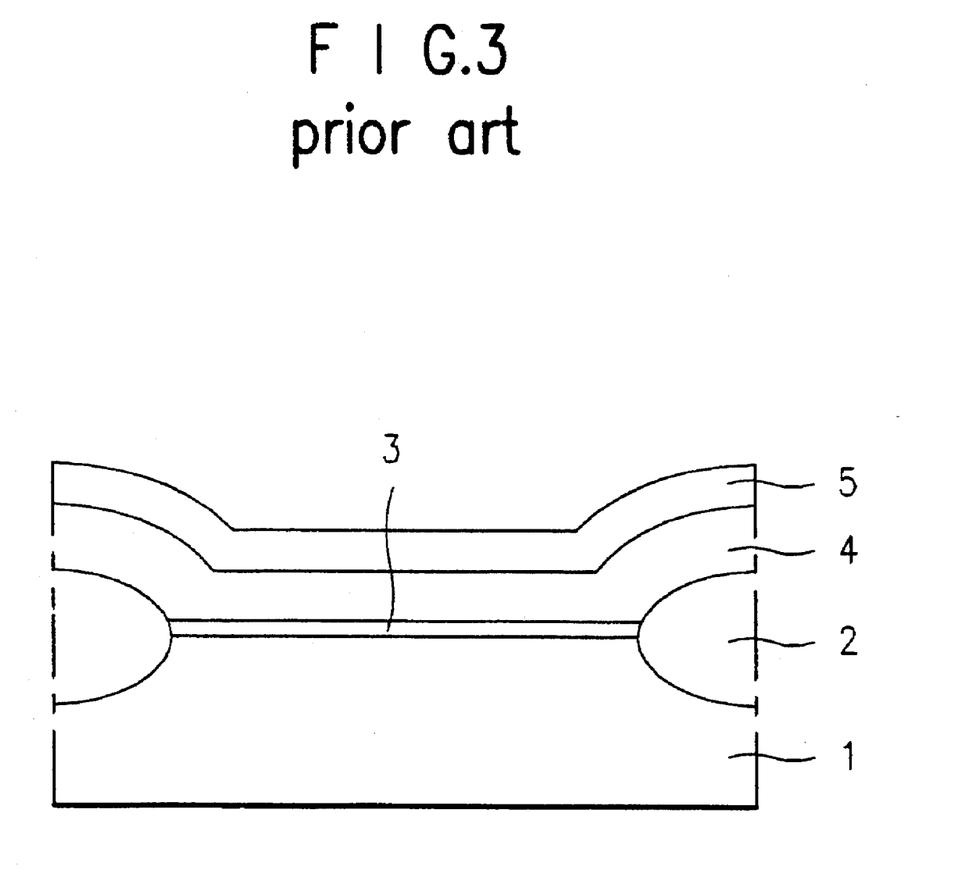
FIG. 3 is a cross-sectional view taken along line II—II of FIG. 1.

FIG. 1 is a plan view of a conventional MOSFET, FIG. 2 is a cross-sectional view taken along line I—I of FIG. 1, FIG. 3 is a cross-sectional view taken along line II—II, and FIGS. 4A to 4D are cross-sectional views showing process steps of manufacturing a conventional MOSFET.

In the construction of a conventional n-channel MOSFET, active and field (i.e. inactive) regions are defined in a P-type semiconductor substrate 1, and a field oxide layer 2 is formed on the semiconductor substrate 1 in a field region (i.e. the inactive region). A gate insulating film 3, a gate electrode 4, and a cap gate insulating film 5 are formed over the active region of the semiconductor substrate 1. Insulating sidewall spacers 7 are formed on sides of the gate insulating layer 3, the gate electrode 4, and the cap gate insulating film. N-type lightly doped impurity regions 6 are formed under the insulating sidewall spacers 7. N-type heavily doped impurity regions 8, which are source and drain regions, are formed at sides of the insulating sidewall spacers 7.

Figure 4A:
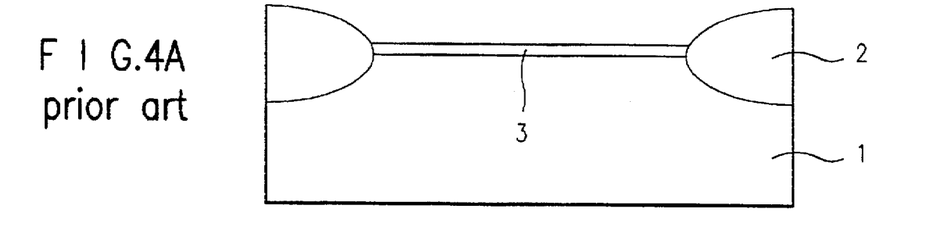
FIGS. 4A to 4D are cross-sectional views showing process steps of the conventional MOSFET, taken along line I—I of FIG. 1.

A method for fabricating the conventional MOSFET will be described with reference to FIGS. 4A to 4D. Referring to FIG. 4A, the field oxide layer 2 is formed on the P-type inactive region of the semiconductor substrate 1, and the gate insulating film 3 is formed over an active region of the semiconductor substrate 1.

Figure 4B:
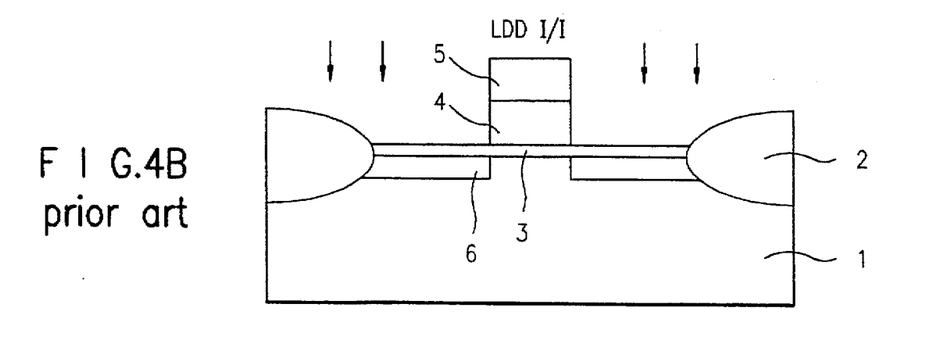

Referring to FIG. 4B, the gate electrode 4 and the cap gate insulating film 5 are successively formed on a predetermined area of the gate insulating film 3. With the gate electrode 4 and the cap gate insulating film 5 serving as masks, N-type impurity ions are lightly implanted, forming the lightly doped impurity regions 6.

Figure 4C:
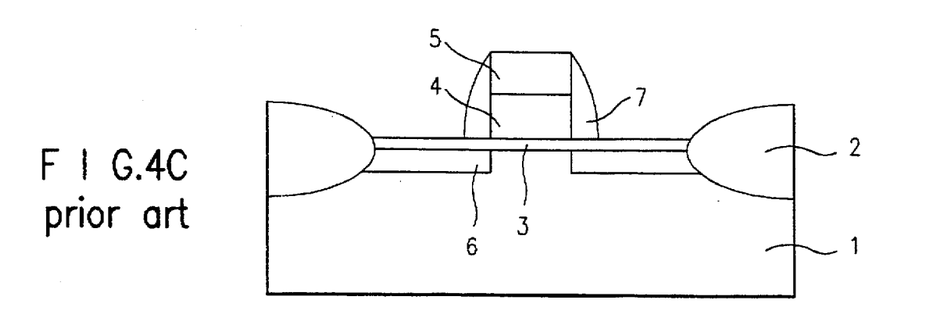

Referring to FIG. 4C, an insulating film is deposited on the structure and is subjected to an anisotropic etch process, forming insulating sidewall spacers 7 which surround the sides of the gate electrode 4 and the cap gate insulating film 5.

Figure 4D:
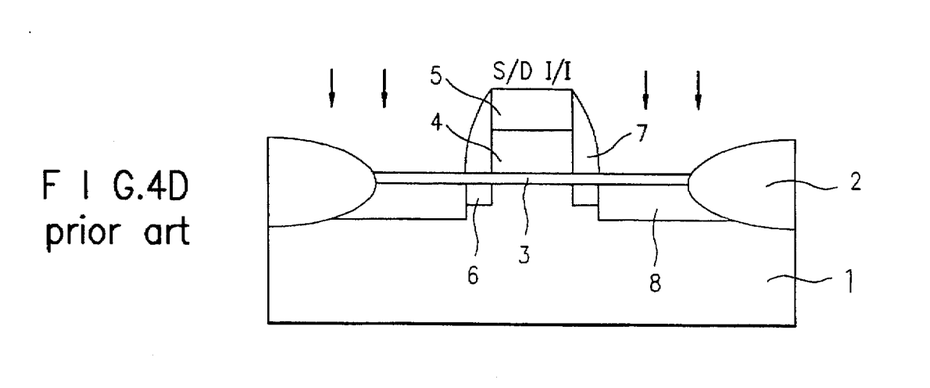

Referring to FIG. 4D, with the cap gate insulating film 5 and the insulating sidewall spacers 7 serving as masks, N-type impurity ions are heavily implanted so that the N-type heavily doped impurity regions 8 are formed beneath the surface of the semiconductor substrate 1 at both sides of the sidewall spacers 7.

The operation of the conventional MOSFET will be described below.

When an oxide layer is used as the gate insulating film 3, a channel is formed in the semiconductor substrate 1 under the gate electrode 4 if a voltage higher than a threshold voltage is applied to the gate electrode 4. As a result, current flows between the source and drain regions. A maximum operating voltage the MOSFET is determined by a gate voltage at which the MOSFET can be safely operated for ten years without degradation of its characteristics. A number of stress tests of MOSFET characteristics are known, such as Fowler-Nordheim (FN), SILC (stress induced leakage current), and TDDB (time-dependent dielectric breakdown) of a gate oxide film or drain voltage Vdd satisfying hot carrier life time of a device for ten years.

The conventional MOSFET has a number of problems. First, since N-type lightly doped impurity regions are formed under the insulating sidewall spacers, drain electric field becomes stronger as channel length becomes shorter, and the operational characteristics of the MOSFET depend on gate insulating film properties at an interface between a semiconductor substrate and the gate insulating film, or between insulating sidewall spacers and the semiconductor substrate. Charge traps generated in the gate insulating film or in the insulating sidewall spacer, eventually cause MOSFET devices to malfunction due to dielectric barrier breakdown.

Second, as the gate insulating film becomes thinner, its reliability worsens. The MOSFET cannot be operated at a high voltage since the maximum voltage at which the device can malfunction is close to the maximum gate voltage.

SUMMARY OF THE INVENTION

Accordingly, the present invention is directed to a semiconductor device and a method for fabricating the same that substantially obviates one or more of problems due to limitations and disadvantages of the related art.

An object of the present invention is to provide a metal air semiconductor field effect transistor (MASFET) and a method for fabricating the same that is operable at a high voltage.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, in a first aspect of the present invention there is provided a semiconductor device, including a semiconductor substrate of a first conductivity type having an active region and an inactive region, a gate electrode formed on the semiconductor substrate over the active region, wherein a gap exists between the semiconductor substrate and the gate electrode, and source and drain regions formed beneath a surface of the semiconductor substrate at both sides of the gate electrode.

In another aspect of the present invention there is provided a semiconductor device, including a semiconductor substrate of a first conductivity type having an active region and an inactive region, a field oxide film formed on the semiconductor substrate over the inactive region, a gate electrode and a cap gate insulating film successively formed on the semiconductor substrate over the active region, wherein a gap exists between the gate electrode and the semiconductor substrate, insulating sidewall spacers formed on two sides of the gate electrode and the cap gate insulating film, lightly doped regions of a second conductivity type formed beneath a surface of the semiconductor substrate under the insulating sidewall spacers; and heavily doped regions of the second conductivity type beneath the surface of the semiconductor substrate beside the insulating sidewall spacer, wherein the lightly doped regions are doped substantially less than the heavily doped regions.

In another aspect of the present invention there is provided a method for fabricating a semiconductor device, including the steps of successively forming a gate insulating film and a gate electrode over an active region of a semiconductor substrate of a first conductivity type, forming source and drain regions beneath a surface of the semiconductor substrate at sides of the gate electrode, removing the gate insulating film to form a gap between the semiconductor substrate and the gate electrode, and forming an insulating film on the entire surface of the semiconductor substrate including the gate electrode.

In another aspect of the present invention there is provided a method for fabricating a semiconductor device, including the steps of successively forming a gate insulating film, a gate electrode, and a cap gate insulating film over an active region of the semiconductor substrate of a first conductivity type, forming lightly doped impurity regions of a second conductivity type beneath a surface of the semiconductor substrate at sides of the gate electrode, forming insulating sidewall spacers beside the gate electrode and the cap gate insulating film, removing the gate insulating film, and forming a first insulating film over the semiconductor substrate, the cap gate insulating film, and the insulating sidewall spacer.

In another aspect of the present invention there is provided a method for fabricating a semiconductor device, including the steps of successively forming a gate insulating film, a gate electrode, and a cap gate insulating film over an active region of a semiconductor substrate of a first conductivity type, forming a first insulating film on sides of the gate electrode and over a surface of the semiconductor substrate, forming lightly doped impurity regions of a second conductivity type beneath the surface of the semiconductor substrate at the sides of the gate electrode, forming an insulating sidewall spacer beside the cap gate insulating film and the first insulating film, removing the gate insulating film and the first insulating film, and forming a second insulating film on the surface of the semiconductor substrate, the cap gate insulating film and the insulating sidewall spacer.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention that together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 5:
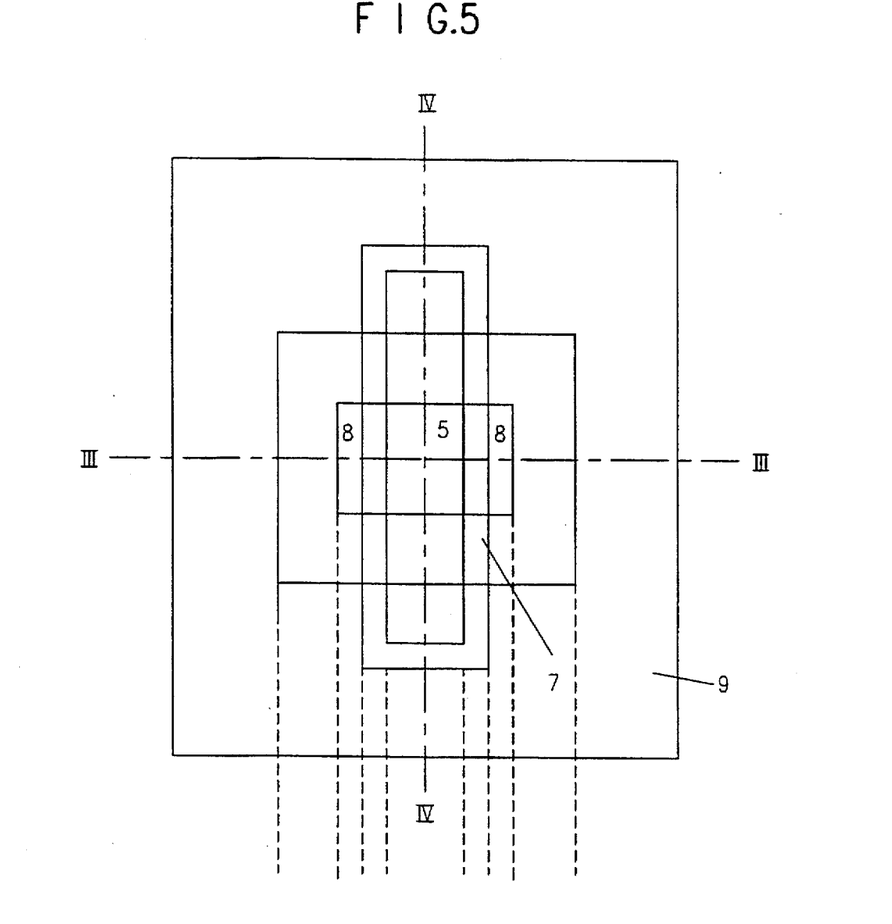
FIG. 5 is a plan view of a MASFET according to a first embodiment of the present invention.
Figure 6:
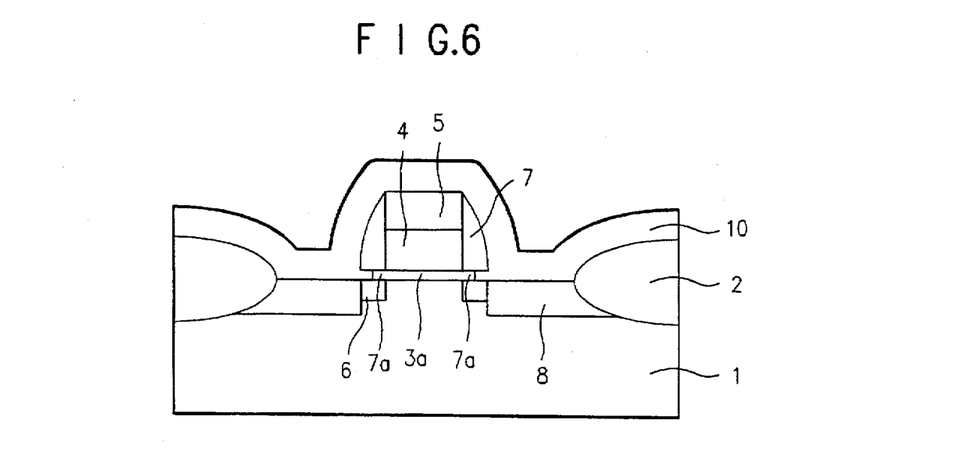
FIG. 6 is a cross-sectional view taken along line III—III of FIG. 5.
Figure 7:
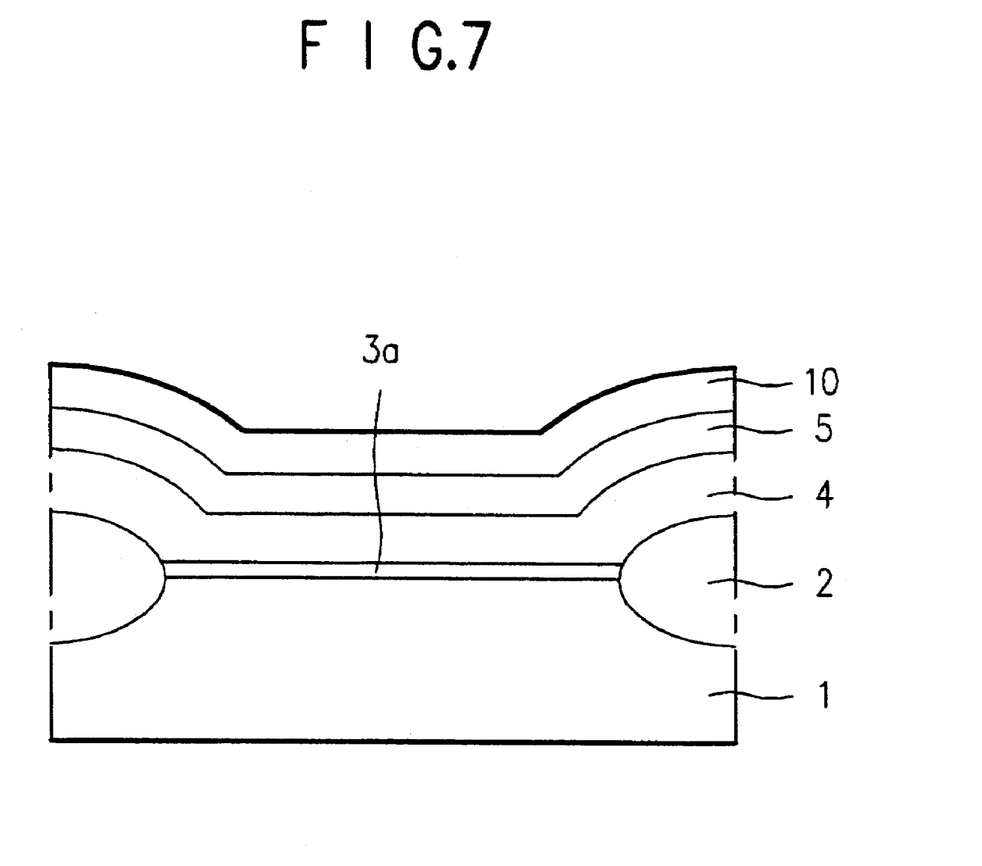
FIG. 7 is a cross-sectional view taken along line IV—IV of FIG. 5.

FIG. 5 is a plan view of a MASFET according to a first embodiment of the present invention, FIG. 6 is a cross-sectional view taken along line III—III of FIG. 5, FIG. 7 is a cross-sectional view taken along line IV—IV of FIG. 5, and FIGS. 8A to 8D are cross-sectional views showing process steps of the MASFET according to the first embodiment of the present invention, taken along line III—III of FIG. 5.

In the first embodiment of the present invention, active and inactive regions are defined in a P-type semiconductor substrate 1. A field oxide film 2 is formed on the semiconductor substrate 1 over the inactive region and a gate electrode 4 and a cap gate insulating film 5 are formed offset from the substrate 1. That is, there exists a gap 3a between the semiconductor substrate 1 and the gate electrode 4 and a gap 7a between the semiconductor substrate 1 and insulating sidewall spacers 7.

The insulating sidewall spacers 7 are formed surrounding sides of the gate electrode 4 and the cap gate insulating film 5. N-type lightly doped impurity regions 6 are formed beneath a surface of the semiconductor substrate 1 under the sidewall spacers 7. N-type heavily doped source and drain regions 8 are formed beneath the surface of the semiconductor surface 1 next to the insulating sidewall spacers 7. An insulating film 10 is formed over the cap gate insulating film 5, the insulating sidewall spacers 7, the semiconductor substrate 1, the N-type heavily doped regions 8, and the field oxide film 2.

A method for fabricating the MASFET of the first embodiment will now be described.

Figure 8A:
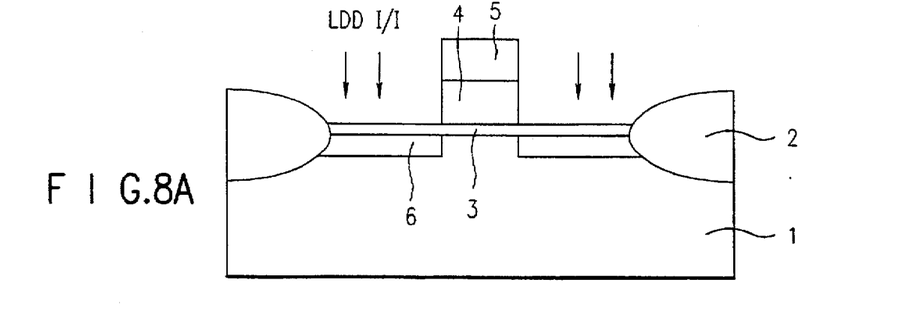
FIGS. 8A to 8D are cross-sectional views showing process steps of manufacturing the MASFET according to a first embodiment of the present invention, taken along line III—III of FIG. 5.

Referring to FIG. 8A, the field oxide film 2 is formed on the P-type semiconductor substrate 1 over the inactive region, and the gate insulating film 3 is formed on the semiconductor substrate 1 over the active region. The gate electrode 4 and the cap gate insulating film 5 are successively formed on a predetermined area of the gate insulating film 3. With the gate electrode 4 and the cap gate insulating film 5 serving as masks, N-type impurity ions are lightly implanted into the semiconductor substrate 1, forming N-type lightly doped impurity regions 6.

Figure 8B:
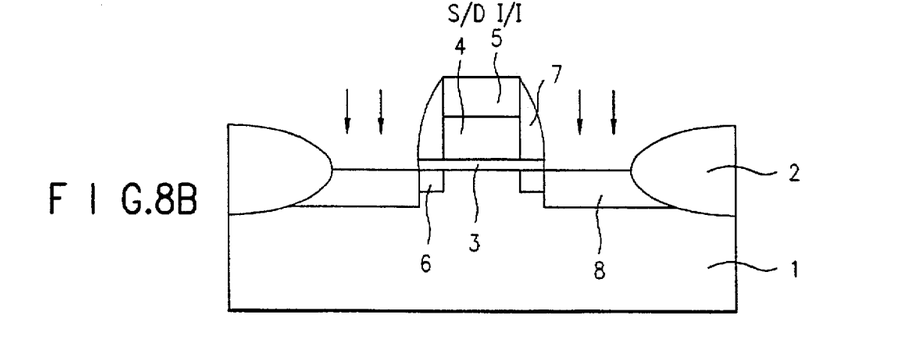

Referring to FIG. 8B, an insulating film is deposited on the entire surface and subjected to an anisotropic etch to form the insulating sidewall spacers 7 surrounding the sides of the gate electrode 4 and the cap gate insulating film 5. With the insulating sidewall spacers 7 and the cap gate insulating film 5 serving as masks, N-type impurity ions are heavily implanted to form N-type heavily doped source and heavily doped drain regions 8 beneath the surface of the semiconductor substrate 1 beside the insulating sidewall spacers 7.

Figure 8C:
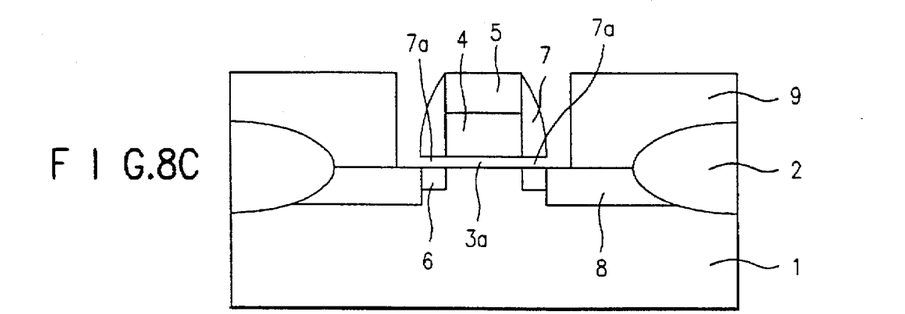

Referring to FIG. 8C, a photoresist film 9 is coated on the substrate 1, the cap gate insulating film 5 and the insulating sidewall spacers 7, and is patterned to expose the cap gate insulating film 5, the insulating sidewall spacers 7, and a predetermined area of the gate insulating film 3 on the N-type heavily doped regions 8 adjacent to the insulating sidewall spacers 7. Next, the gate insulating film 3 under the gate electrode 4 and the insulating sidewall spacers 7 are removed.

Figure 8D:
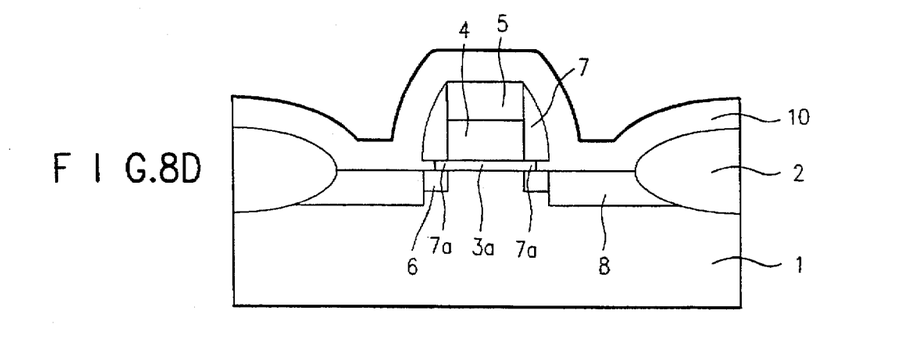

Referring to FIG. 8D, the photoresist film 9 is removed entirely, and an insulating film 10 is formed over the structure including the cap gate insulating film 5 and the insulating sidewall spacers 7. At this time, the gap 7a exists between the insulating sidewall spacers 7 and the semiconductor substrate 1 and the gap 3a exists between the gate electrode 4 and the semiconductor substrate 1.

A semiconductor device and a method for fabricating the same according to the second embodiment of the present invention will now be described.

Figure 9:
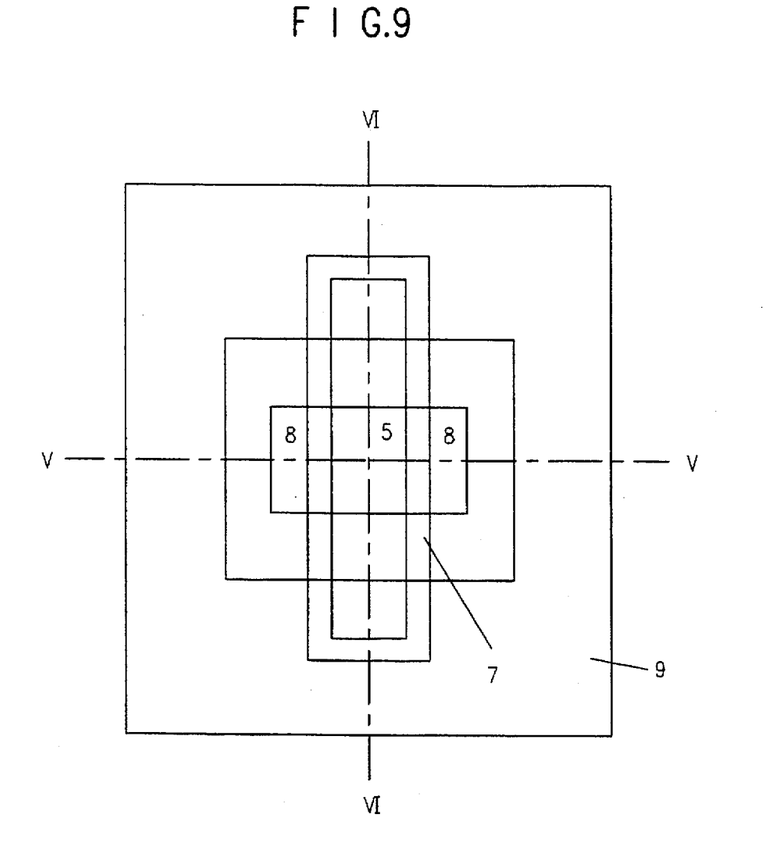
FIG. 9 is a plan view of an MASFET according to a second embodiment of the present invention.
Figure 10:
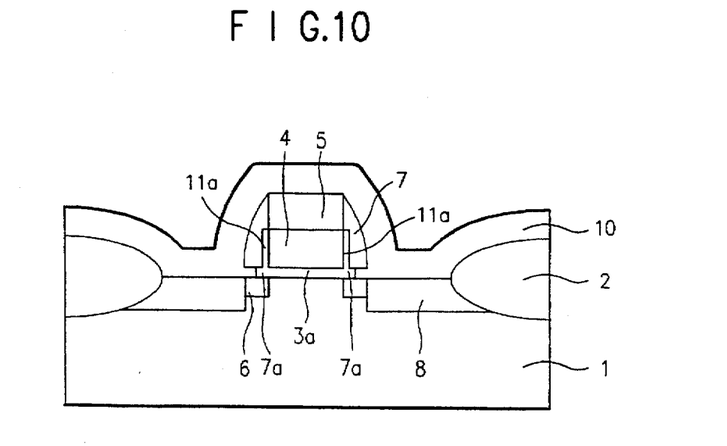
FIG. 10 is a cross-sectional view taken along line V—V of FIG. 9.
Figure 11:
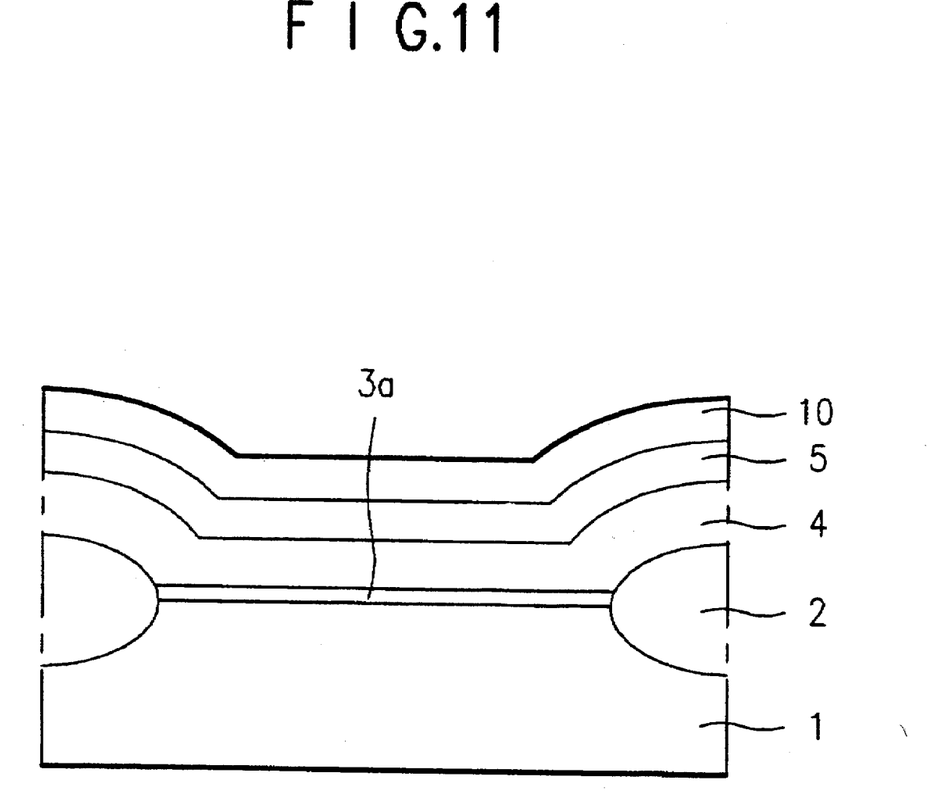
FIG. 11 is a cross-sectional view taken along line VI—VI of FIG. 9.

FIG. 9 is a plan view of a MASFET according to a second embodiment of the present invention. FIG. 10 is a cross-sectional view taken along line V—V of FIG. 9. FIG. 11 is a cross-sectional view taken along line VI—VI of FIG. 9, and FIGS. 12A to 12D are cross-sectional views showing process steps of a method for fabricating the MASFET according to the second embodiment of the present invention, taken along line I—I of FIG. 9.

In the second embodiment of the present invention, a gap exists between a gate electrode and insulating sidewall spacers as well as between the gate electrode and a semiconductor substrate.

Active and inactive regions are defined in a P-type semiconductor substrate 1. A field oxide film 2 is formed on the semiconductor substrate 1 over the inactive region, and a gate electrode 4 and a cap gate insulating film 5 are successively formed on the semiconductor substrate 1 over the active region, spaced apart from the semiconductor substrate 1. That is, there is a gap 3a between the semiconductor substrate 1 and the gate electrode 4.

Insulating sidewall spacers 7 are formed surrounding sides of the gate electrode 4 and the cap gate insulating film 5. A gap 11a exists between the insulating sidewall spacers 7 and the gate electrode 4.

N-type lightly doped impurity regions 6 are formed beneath the surface of the semiconductor substrate 1 under the insulating sidewall spacers 7. N-type heavily doped source and drain regions 8 are formed beneath a surface of the semiconductor substrate 1 at sides of the insulating sidewall spacers 7.

An insulating film 10 is formed on the cap gate insulating film 5, the insulating sidewall spacers 7, the N-type heavily doped source and drain regions 8, and the field oxide film 2.

A method for fabricating the MASFET of the second embodiment will be now described.

Figure 12A:
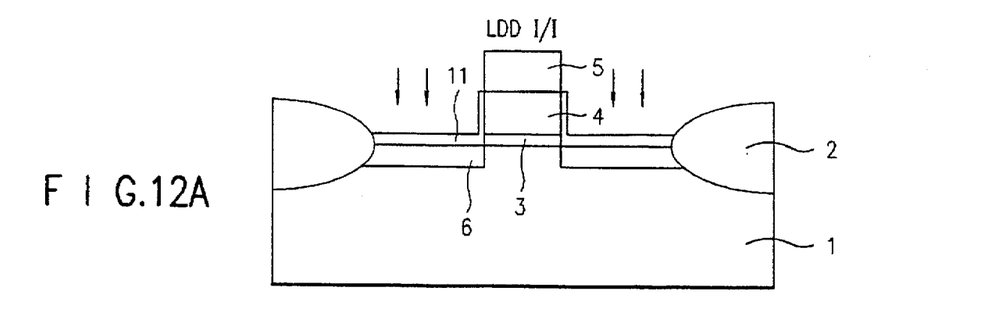
FIGS. 12A to 12D are cross-sectional views showing process steps of a method for fabricating the MASFET according to the second embodiment of the present invention, taken along line V—V of FIG. 9.

Referring to FIG. 12A, the field oxide film 2 is formed on the P-type semiconductor substrate 1 over the inactive region. The gate insulating film 3, the gate electrode 4, and the cap gate insulating film 5 are successively formed on a predetermined area of the semiconductor substrate 1 over the active region. A first insulating film 11 including, e.g., a thin oxide film, is formed on the exposed semiconductor substrate 1 and the sides of the gate electrode 4. An oxide film is formed using a thermal oxidation process to form the first insulating film 11. With the gate electrode 4 and the cap gate insulating film 5 serving as masks, N-type impurity ions are lightly implanted into the semiconductor substrate 1, forming N-type lightly doped impurity regions 6.

Figure 12B:
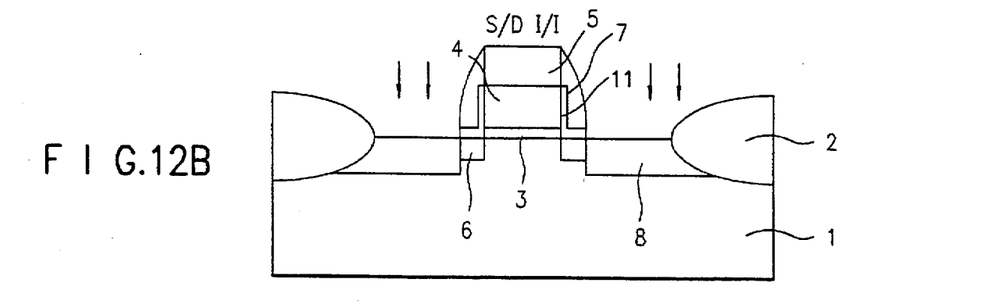

Referring to FIG. 12B, an insulating film is deposited on the entire structure, and is anisotropically etched to form the insulating sidewall spacers 7 surrounding the first insulating film 11 and the sides of the cap gate insulating film 5. With the insulating sidewall spacers 7 and the cap gate insulating film 5 serving as masks, N-type impurity ions are heavily implanted, forming heavily doped N-type source and drain regions 8 beneath the surface of the semiconductor substrate 1 beside the insulating sidewall spacers 7.

Figure 12C:
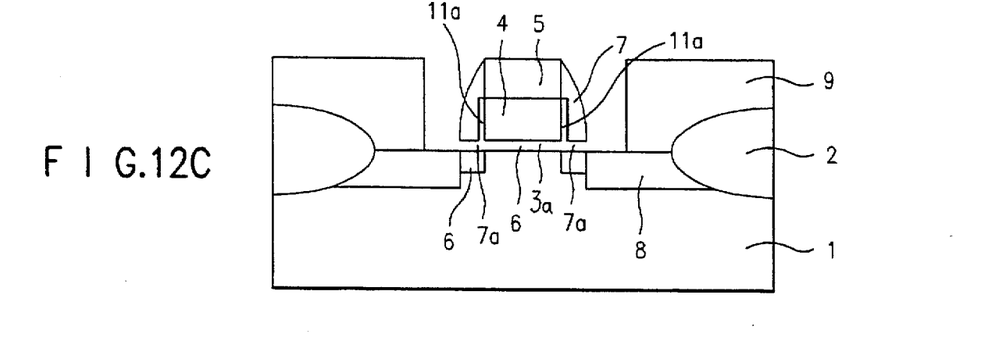

Referring to FIG. 12C, a photoresist film 9 is coated on the structure and patterned to expose the cap gate insulating film 5, the insulating sidewall spacers 7, and the first insulating film 11 over the heavily doped N-type source and drain regions 8 adjacent to the insulating sidewall spacers 7. The first insulating film 11 and the gate insulating film 3 are then removed. The photoresist film 9 is patterned to expose a center portion of the active region.

Figure 12D:
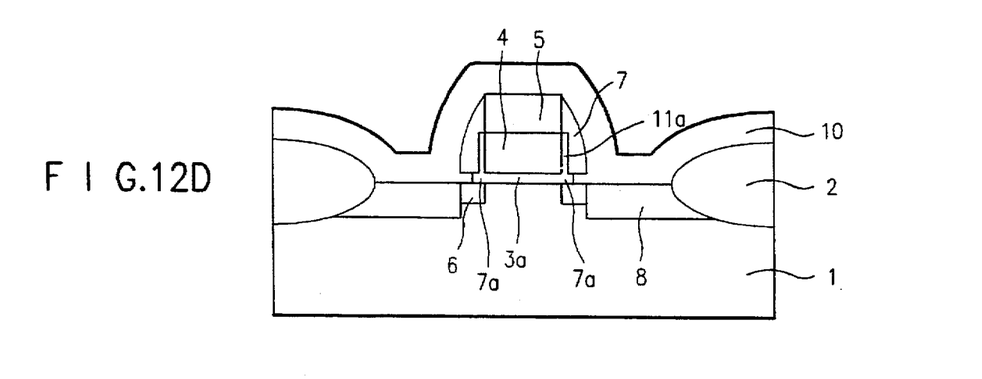

Referring to FIG. 12D, remaining photoresist film 9 is removed entirely. A second insulating film 10 is coated onto the entire surface of the semiconductor substrate 1 including the cap gate insulating film 5 and the insulating sidewall spacers 7. Accordingly, there is a gap 11a between the gate electrode 4 and the insulating sidewall spacers 7, a gap 3a between the semiconductor substrate 1 and the gate electrode 4, and a gap 7a between the semiconductor substrate 1 and the insulating sidewall spacers 7.

A semiconductor device and a method for fabricating the same according to a third embodiment of the present invention will be described below.

Figure 13:
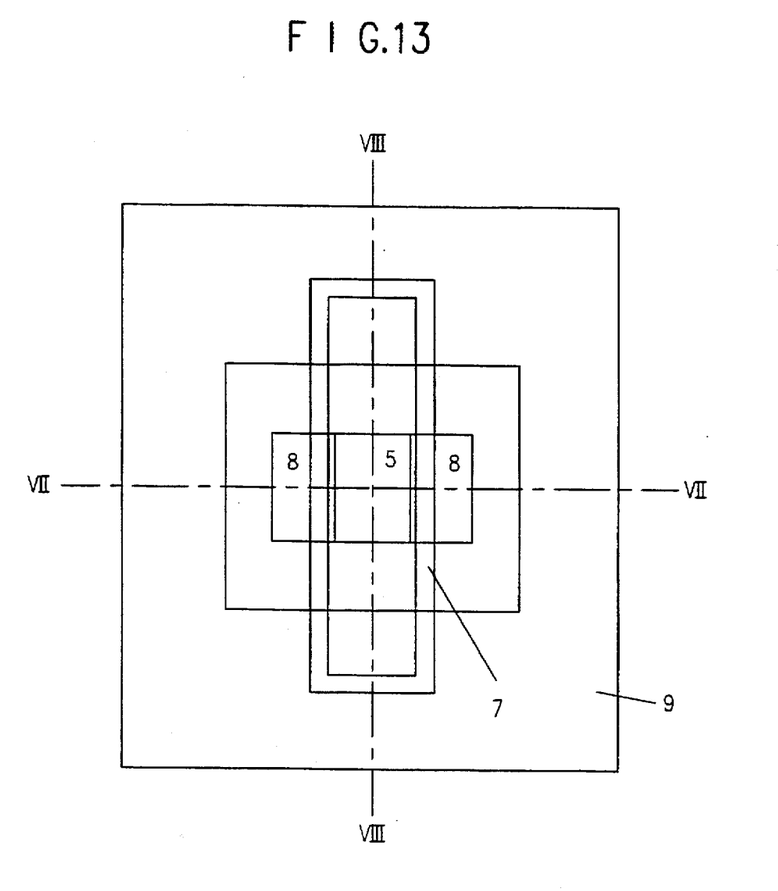
FIG. 13 is a plan view of an MASFET according to a third embodiment of the present invention.
Figure 14:
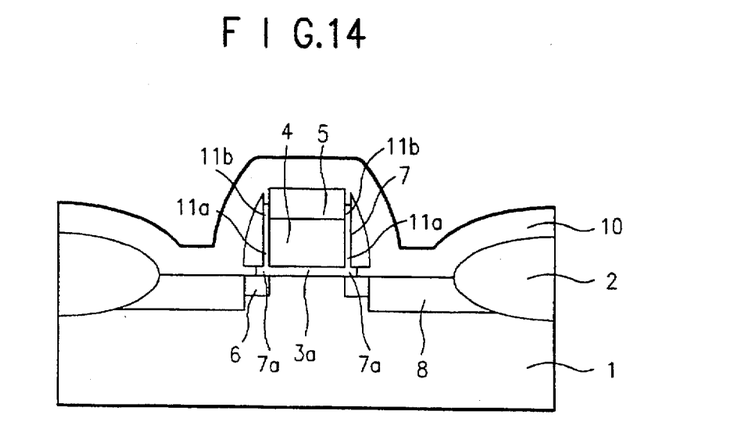
FIG. 14 is a cross-sectional view taken along line VII—VII of FIG. 13.
Figure 15:
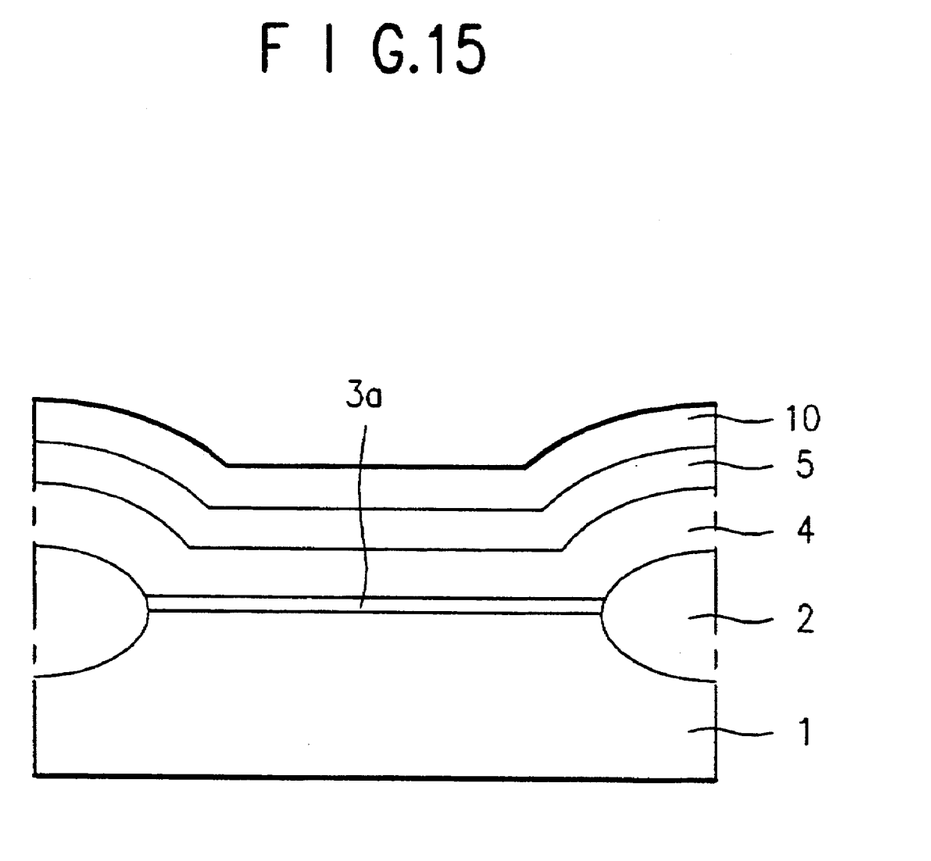
FIG. 15 is a cross-sectional view taken along line VIII—VIII of FIG. 13.

FIG. 13 is a plan view of a MASFET according to the third embodiment of the present invention. FIG. 14 is a cross-sectional view taken along line VII—VII of FIG. 13. FIG. 15 is a cross-sectional view taken along line VIII—VIII of FIG. 13, and FIGS. 16A to 16D are cross-sectional views showing process steps of a method for fabricating the MASFET according to the third embodiment of the present invention, taken along line VII—VII of FIG. 13.

In the third embodiment of the present invention, a gap extends further than in the second embodiment, extending between a gate electrode and a cap gate insulating film and insulating sidewall spacers.

In the MASFET structure of the third embodiment, active and inactive regions are defined in a P-type semiconductor substrate 1. A field oxide film 2 is formed on the semiconductor substrate 1 over the inactive region, and a gate electrode 4 and a cap gate insulating film 5 are formed on a predetermined area of the semiconductor substrate 1 over the active region. Insulating sidewall spacers 7 are formed surrounding sides of the gate electrode 4 and the cap gate insulating film 5, and are spaced apart from them. Thus there is a gap 3a between the semiconductor substrate 1 and the gate electrode 4, a gap 11a between the insulating sidewall spacers 7 and gate electrode 4, a gap 11b between the insulating sidewall spacers 7 and the cap gate insulating film 5, and a gap 7a between the insulating spacers 7 and the semiconductor substrate 1.

N-type lightly doped impurity regions 6 are formed beneath the surface of the semiconductor substrate 1 under the insulating sidewall spacers 7, and N-type heavily doped source and drain regions 8 are formed beneath the surface of the semiconductor substrate 1 beside the insulating sidewall spacers 7.

An insulating film 10 is formed on the cap gate insulating film 5, the insulating sidewall spacers 7, the N-type heavily doped source and drain regions 8, and the field oxide film 2.

A method for fabricating the MASFET of the third embodiment will now be described.

Figure 16A:
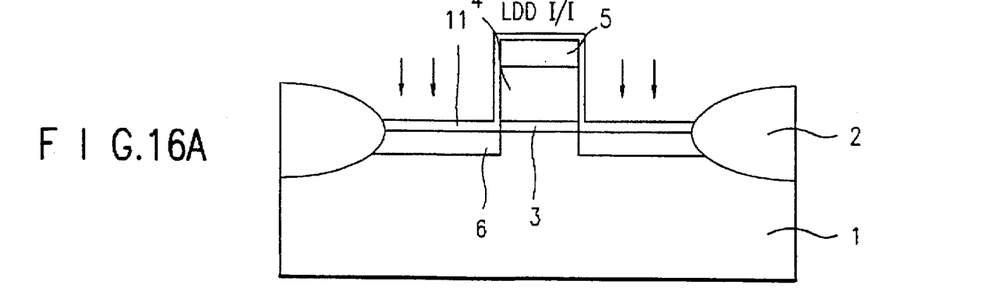
FIGS. 16A to 16D are cross-sectional views showing process steps of a method for fabricating the MASFET according to the third embodiment of the present invention, taken along line VII—VII of FIG. 13.

Referring to FIG. 16A, a field oxide film 2 is formed on a P-type semiconductor substrate 1 over the inactive region. The gate insulating film 3, the gate electrode 4, and the cap gate insulating film 5 are successively formed on a predetermined area of the semiconductor substrate 1 over the active region. A first insulating film 11 made of a thin oxide film is formed on the exposed semiconductor substrate 1 including the cap gate insulating film 5 and the gate electrode 4. A chemical vapor deposition (CVD) process is used to form the insulating film 11. With the gate electrode 4 and the cap gate insulating film 5 serving as masks, N-type impurity ions are lightly implanted into the semiconductor substrate 1 on both sides of the gate electrode 4, forming N-type lightly doped impurity regions 6 beneath the surface of the semiconductor substrate 1.

Figure 16B:
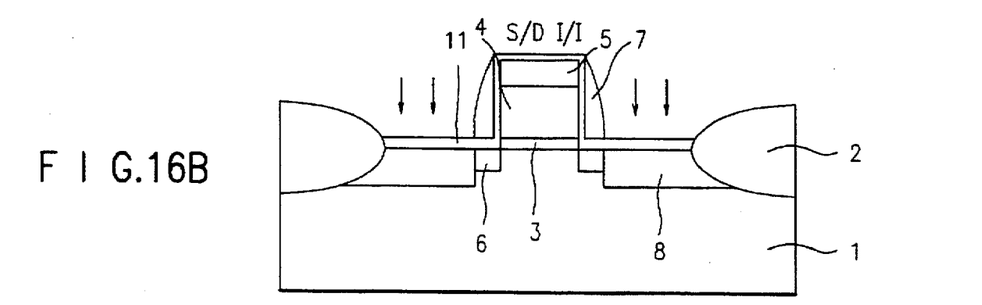

Referring to FIG. 16B, an insulating film is deposited on the entire surface, and is subjected to an anisotropic etch process, forming insulating sidewall spacers 7 on longitudinal sides of the first insulating film 11.

With the insulating sidewall spacers 7 and the cap gate insulating film 5 serving as masks, N-type impurity ions are heavily implanted into the semiconductor substrate 1 at sides of the insulating sidewall spacers 7, forming the N-type heavily doped source and drain regions 8.

Figure 16C:
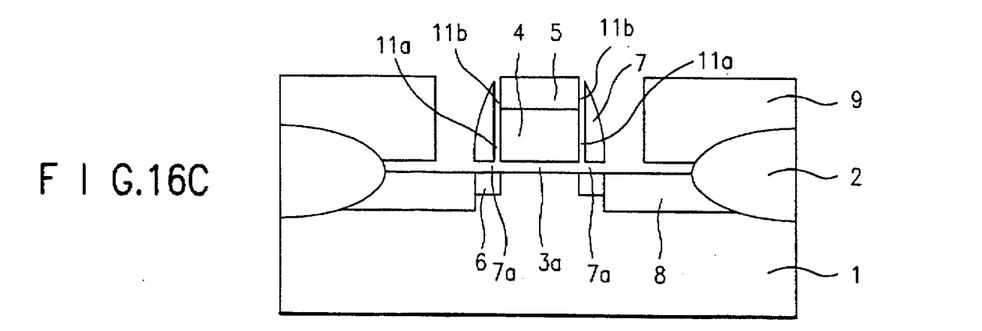

Referring to FIG. 16C, a photoresist film 9 is coated onto the structure, and patterned to expose the cap gate insulating film 5, the insulating sidewall spacers 7, and the first insulating film 11 on the N-type heavily doped source and drain regions 8 adjacent to the insulating sidewall spacers 7. Then the first insulating film 11 and the gate insulating film 3 are removed. The photoresist film 9 is patterned to expose a center portion of the active region.

Figure 16D:
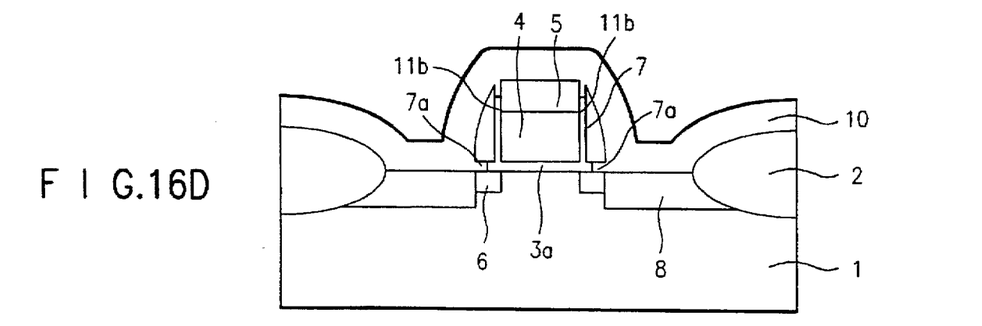

Referring to FIG. 16D, the photoresist film 9 is removed entirely. The second insulating film 10 is formed over the entire structure including the semiconductor substrate 1, the cap gate insulating film 5 and the insulating sidewall spacers 7. Accordingly, the gaps 11a, 11b, 3a and 7a are formed between the insulating sidewall spacers 7 and the gate electrode 4, between the insulating sidewall spacers 7 and the cap gate insulating film 5, between the semiconductor substrate 1 and the gate electrode 4 and between the semiconductor substrate 1 and the insulating sidewall spacers 7, respectively.

The semiconductor devices and the methods for fabricating the same described above have the following advantages. First, an air dielectric constant $\epsilon_r$ is almost 1 and a dielectric constant $\epsilon_r$ of an oxide film used as a gate insulating film is about 3.9. Thus, when the gate oxide film having a thickness of $T_{ox}$ is replaced by air, a thickness $T_{eq}$ of an effective gate insulating film is $4 \times T_{ox}$.

Second, when a gate insulating film made of an oxide is removed between a gate electrode and a semiconductor substrate, leakage current between the gate and the substrate can be reduced.

Third, since a gap is formed between the gate electrode and the substrate, it is possible to obtain good reliability of the transistor.

Fourth, since the leakage current between the gate electrode and the substrate is reduced and good reliability of the transistor can be obtained, a high gate voltage can be used.

Fifth, since hot carriers generated in operation of a transistor can be prevented and charge traps in a gate oxide film are not generated, a high drain voltage can be used.

Sixth, since a high gate voltage and a high drain voltage can be used, the entire device can be operable at a high voltage.

While the invention has been described in detail and with reference to specific embodiments thereof, it will be apparent to those skilled in the art that various modification and variations can be made therein without departing from the spirit or scope of the inventions. Thus, it is intended that the present invention cover the modifications and variations of this invention provided they come within the scope of the appended claims and their equivalents.

What is claimed is:

1. A method for fabricating a semiconductor device, comprising the steps of:

successively forming a gate insulating film and a gate electrode over an active region of a semiconductor substrate of a first conductivity type;

forming source and drain regions beneath a surface of the semiconductor substrate at sides of the gate electrode;

removing the gate insulating film to form a gap between the semiconductor substrate and the gate electrode with no intervening layers between the semiconductor substrate and the gate electrode; and forming an insulating film on the entire surface of the semiconductor substrate including the gate electrode.

2. A method for fabricating a semiconductor device, comprising the steps of:

successively forming a gate insulating film, a gate electrode, and a cap gate insulating film over an active region of the semiconductor substrate of a first conductivity type;

forming lightly doped impurity regions of a second conductivity type beneath a surface of the semiconductor substrate at sides of the gate electrode;

forming an insulating sidewall spacer beside the gate electrode and the cap gate insulating film;

removing the gate insulating film so that a gap between the semiconductor substrate and the gate electrode with no intervening layers between the semiconductor substrate and the gate electrode is formed; and forming a first insulating film over the semiconductor substrate, the cap gate insulating film, and the insulating sidewall spacer.

3. A method for fabricating a semiconductor device, comprising the steps of:

successively forming a gate insulating film and a gate electrode with no intervening layers therebetween, and a cap gate insulating film over an active region of a semiconductor substrate of a first conductivity type;

forming a first insulating film on sides of the gate electrode and over a surface of the semiconductor substrate;

forming lightly doped impurity regions of a second conductivity type beneath the surface of the semiconductor substrate at the sides of the gate electrode;

forming an insulating sidewall spacer beside the cap gate insulating film and the first insulating film;

removing the gate insulating film and the first insulating film; and forming a second insulating film on the surface of the semiconductor substrate, the cap gate insulating film and the insulating sidewall spacer; and wherein the step of removing the gate insulating film and the first insulating film forms a gap between the semiconductor substrate and the gate electrode.

4. The method of claim 3, wherein the step of forming the first insulating film includes the step of forming a thermal oxide film.

5. The method of claim 3, wherein the step of forming the first insulating film includes the step of forming the first insulating film on an entire surface of the semiconductor substrate including sides of the cap gate insulating film and the gate electrode.

6. The method of claim 3, wherein the step of forming the first insulating film includes the step of forming the first insulating film with a chemical vapor deposition process.

7. The method of claim 3, wherein the step of forming an insulating sidewall spacer includes anisotropically etching the first insulating film.

8. The method of claim 3, wherein the step of removing the gate insulating film and the first insulating film forms a gap between the semiconductor substrate and the gate electrode, and between the insulating sidewall spacers and the gate electrode.

9. The method of claim 3, wherein the step of removing the gate insulating film and the first insulating film forms a gap between the semiconductor substrate and the gate electrode, between the insulating sidewall spacers and the gate electrode, and between the insulating sidewall spacers and the cap gate insulating film.

* * * * *